(12) United States Patent  
Ma

(10) Patent No.: US 12,175,032 B2
(45) Date of Patent: Dec. 24, 2024

(54) DISPLAY PANEL AND DISPLAY DEVICE

(71) Applicant: Xiamen Tianma Display Technology Co., Ltd., Xiamen (CN)

(72) Inventor: Hongshuai Ma, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/103,771

(22) Filed: Jan. 31, 2023

(65) Prior Publication Data

US 2023/0168758 A1    Jun. 1, 2023

(30) Foreign Application Priority Data

Jun. 30, 2022   (CN) .......................... 202210772839.1

(51) Int. Cl.
  *G06F 3/041*  (2006.01)
  *G06F 3/044*  (2006.01)
  *H10K 59/40*  (2023.01)
  *G06V 40/13*  (2022.01)

(52) U.S. Cl.
  CPC .......... *G06F 3/0412* (2013.01); *G06F 3/0443* (2019.05); *G06F 3/0446* (2019.05); *H10K 59/40* (2023.02); *G06F 2203/04112* (2013.01); *G06V 40/1318* (2022.01)

(58) Field of Classification Search
  CPC ..... G06F 3/0412; G06F 3/0443; G06F 3/0446
  USPC .................................................. 345/173, 174
  See application file for complete search history.

(56) References Cited

U.S. PATENT DOCUMENTS

2021/0335920 A1* 10/2021 Hong ................... H10K 50/865
2023/0199294 A1*  6/2023 Lee ........................ H04N 23/57
                                                      348/374

* cited by examiner

*Primary Examiner* — Calvin C Ma
(74) *Attorney, Agent, or Firm* — KDW Firm PLLC

(57) ABSTRACT

Provided are a display panel and a display device. The display panel includes a first display region and a second display region. The second display region also serves as the photosensor region. The second display region, including a plurality of light-proof regions and light-transmissive regions, further includes a touch function layer which itself includes multiple touch electrodes. Within the second display region, the touch electrodes and the light-proof regions overlap at least partially, and the touch electrodes and light-transmissive regions do not overlap at least partially.

19 Claims, 12 Drawing Sheets

DISPLAY PANEL AND DISPLAY DEVICE

CROSS-REFERENCE TO RELATED APPLICATION

This application claims priority to Chinese Patent Application No. 202210772839.1 filed Jun. 30, 2022, the disclosure of which is incorporated herein by reference in its entirety.

TECHNICAL FIELD

Embodiments of the present disclosure relate to a display technology and, in particular, to a display panel and a display device.

BACKGROUND

With the development of display technology, full screens almost occupy a large proportion in the consumer goods market and have become a hot topic for developers. For example, under-screen cameras and under-screen fingerprint recognition products have been put into application.

To improve the performance of an existing display panel, a thin-film transistor based on low-temperature polycrystalline silicon and a thin-film transistor based on a metal oxide semiconductor are used in the display panel, resulting in a complex arrangement of films and wires at the transistor array layer. In addition, the design of the touch function layer affects the light transmittance of the under-screen camera or the region of parallel fingerprint recognition, thus affecting the performance of the display panel.

SUMMARY

Embodiments of the present disclosure provide a display panel and a display device to address the lack of light transmittance of a light-transmissive region in an existing display panel, so that the performance of the display panel can be enhanced.

In a first aspect, embodiments of the present disclosure provide a display panel which comprises a first display region and a second display region. The second display region, comprising a plurality of light-proof regions and a plurality of light-transmissive regions, also serves as the photosensor region. The display panel includes a touch function layer. The touch function layer includes a plurality of touch electrodes.

Within the second display region, a touch electrode of the plurality of touch electrodes and a light-proof region of the plurality of light-proof regions overlap at least partially, and the touch electrode and a light-transmissive region of the plurality of light-transmissive regions do not overlap at least partially.

In a second aspect, embodiments of the present disclosure also provide a display device which includes the abovementioned display panel.

DETAILED DESCRIPTION

Figure 1:
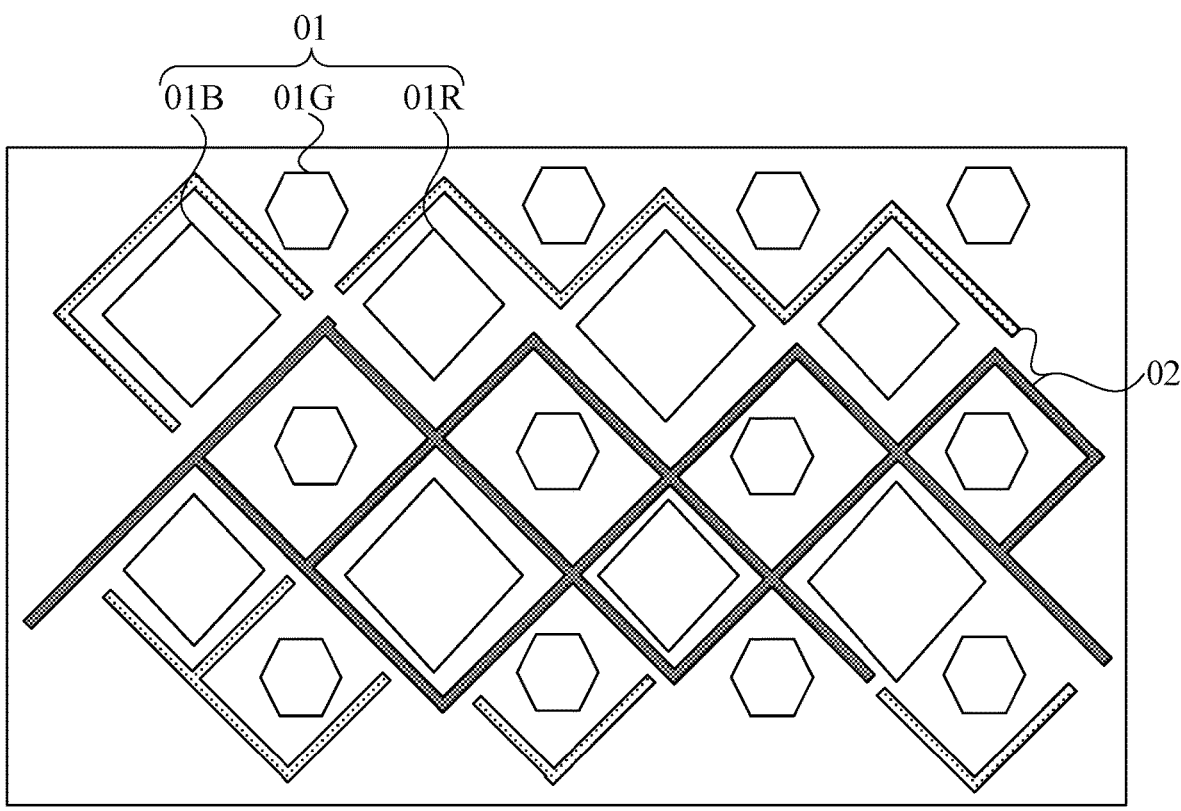
FIG. 1 is a partial view illustrating the structure of a display panel in the related art.

The present disclosure is also described hereinafter in detail in conjunction with drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

Terms used in embodiments of the present disclosure are used to describe the embodiments and not intended to limit the present disclosure. It is to be noted that spatially related terms, including "on", "below", "left" and "right" used in embodiments of the present disclosure, are described from the perspective of the drawings, and are not to be construed as a limitation to the present disclosure. In addition, in the context, it is to be understood that when a component is formed "on" or "below" another component, the component may not only be directly formed "on" or "below" another component and may also be indirectly formed "on" or "below" another component via an intermediate component. Terms "first", "second" and the like are used for description and distinguishing between different components rather than indicating any order, quantity, or importance. For those of ordinary skill in the art, the preceding terms can be construed depending on the actual situation in the present disclosure.

An organic light-emitting diode (OLED) device is simply structured and self-luminous, and the OLED device has high contrast, responds fast, and consumes low electricity. All the advantages make the OLED device popular in the display field such as mobile phones, tablet computers, and TVs. With the improvement of the integration of the display panel, the technique of setting the touch function layer (touch panel) on thin-film transistor (TPOT) has been widely applied. FIG. 1 is a partial view illustrating the structure of a display panel in the related art. Referring to FIG. 1, the display panel includes multiple sub-pixels 01, where the sub-pixels 01 may include the red sub-pixel 01R, the green sub-pixel 01G, and the blue sub-pixel 01B. Each sub-pixel 01 includes one light-emitting element located within a pixel opening of a pixel defining layer. The touch electrode wire 02 of TPOT is generally set in the non-opening area of the pixel defining layer, that is, the area between the light-emitting elements), which corresponds exactly to the position where the light-transmissive region is designed on the display panel. Since the touch electrode trace is light-proof, the light transmittance of the light-transmissive region will be affected.

In view of this, embodiments of the present disclosure provide a display panel. The display panel includes a first display region and a second display region. The second display region also serves as the photosensor region. The second display region includes multiple light-proof regions and light-transmissive regions. The display panel includes a touch function layer which includes multiple touch electrodes. Within the second display region, a touch electrode and a light-proof region overlap at least partially, and the touch electrode and a light-transmissive region do not overlap at least partially.

The multiple light-transmissive regions in the second display region enable external light to penetrate the display panel by passing through the light-transmissive region and then be received by the photosensor (such as a camera or a fingerprint recognition module). Pixel units are disposed in the light-transmissive regions, and the second display region is provided with the multiple light-proof regions; thereby normal display of the second display region is achieved, and thus the screen-to-body ratio of the display panel is improved and the full screen display is realized. The touch electrodes and the light-transmissive regions do not overlap at least partially in the second display region so that the light transmittance of the light-transmissive regions is increased. In this manner, the imaging quality of the camera or the accuracy of the fingerprint recognition module is improved, and thus the performance of the display panel is improved.

The above is the core idea of the present disclosure. The following describes embodiments of the present disclosure in detail with reference to drawings.

Figure 2:
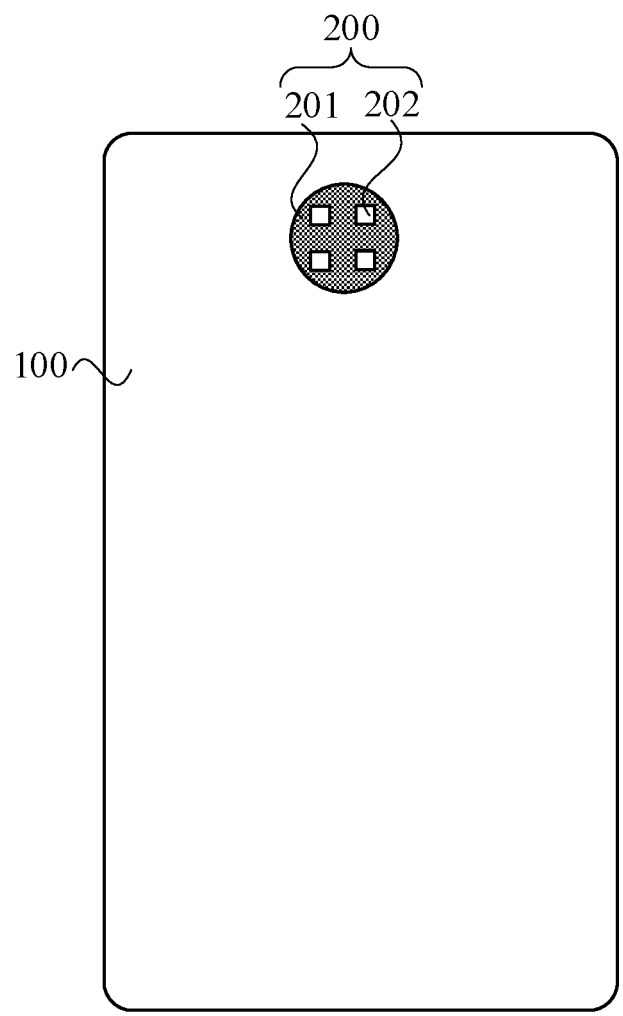
FIG. 2 is a diagram illustrating the structure of a display panel according to an embodiment of the present disclosure.

FIG. 2 is a diagram illustrating the structure of a display panel according to an embodiment of the present disclosure.

Referring to FIG. 2, the display panel according to this embodiment of the present disclosure includes a first display region 100 and a second display region 200, the first display region 100 is a conventional display region, and the second display region 200 also serves as a photosensor region for accommodating the photosensor. The second display region 200 includes a light-proof region 201 and multiple light-transmissive regions 202. Both the light-proof region and the first display region are provided with light-emitting elements (not shown in FIG. 2) to achieve image display. The light-transmissive region can transmit external light to be received by the photosensors below the display panel.

It is to be understood that the display panel according to this embodiment of the present disclosure is applicable to the display device whose photosensors require being disposed under the screen. The photosensor may be a camera. Due to the high requirements of the camera on light rays, a hollowed area is generally disposed at the edge of or inside the display region in the related art, but the hollowed area cannot display the image, so it is difficult to achieve a real full screen display. Since the opening for receiving light of the camera is generally circular, the exemplary second display region 200 shown in FIG. 2 is also circular.

In an embodiment, one or more second display regions 200 may be provided. Also, the second display region 200 may be a continuous region, or the second display region 200 may be a discontinuous area, which may depend on the actual application environment, and is not limited herein. In some embodiments, the relative position between the first display region 100 and the second display region 200 may be that at least part of an edge of the second display region 200 coincides with at least part of an edge of the first display region 100, and the remainder of the second display region 200 is surrounded by the first display region 100. In this manner, the second display region 200 may be disposed at the edge of the display region of the display panel. In other embodiments, the relative position between the first display region 100 and the second display region 200 may also be that the first display region 100 surrounds the second display region 200. In this way, the region 200 may be disposed inside the display region of the display panel, as shown in FIG. 2. For example, the second display region 200 may be disposed at the upper left corner of the first display region 100. For another example, the second display region 200 may be disposed at the upper right corner of the first display region 100. For another example, the second display region 200 may be disposed on the left side of the first display region 100. For another example, the second display region 200 may be disposed on the upper side of the first display region 100. Of course, in actual application, the location of the second display region 200 may be determined according to the application environment, and is not limited herein.

In an embodiment, the shape of the second display region 200 may be set to a regular shape, such as a rectangle, the vertex angles of which may be right angles or arc angles. For another example, the shape of the second display region 200 may be set to a trapezoid, which may be a regular trapezoid or an inverted trapezoid. In addition, the vertex angles of the trapezoidal may be normal included angles or may be arc angles. For another example, the shape of the second display region 200 may be set to an irregular shape. For example, the shape of the second display region 200 may be set to a droplet shape. Of course, in actual application, the shape of the second display region 200 may be determined according to the shape of the elements provided in the second display region 200, and is not limited herein.

In an embodiment, the area of the second display region 200 is smaller than that of the first display region 100. Of course, in actual application, the area of the second display region 200 may be determined according to the elements provided in the second display region 200, and is not limited herein.

This embodiment of the present disclosure does not limit the shape of the first display region 100 and the second display region 200 and their relative position. The shape and the relative position in actual application may be set according to the screen design of the display device. Taking mobile phone as an example, the second display region 200 may be set at the upper left corner of the display region, or the second display region 200 may be set at the upper right corner of the display region. With the camera set at the corner, the second display region 200 can be configured to perform simple and quick functions such as displaying time and weather, and reminding information.

Figure 3:
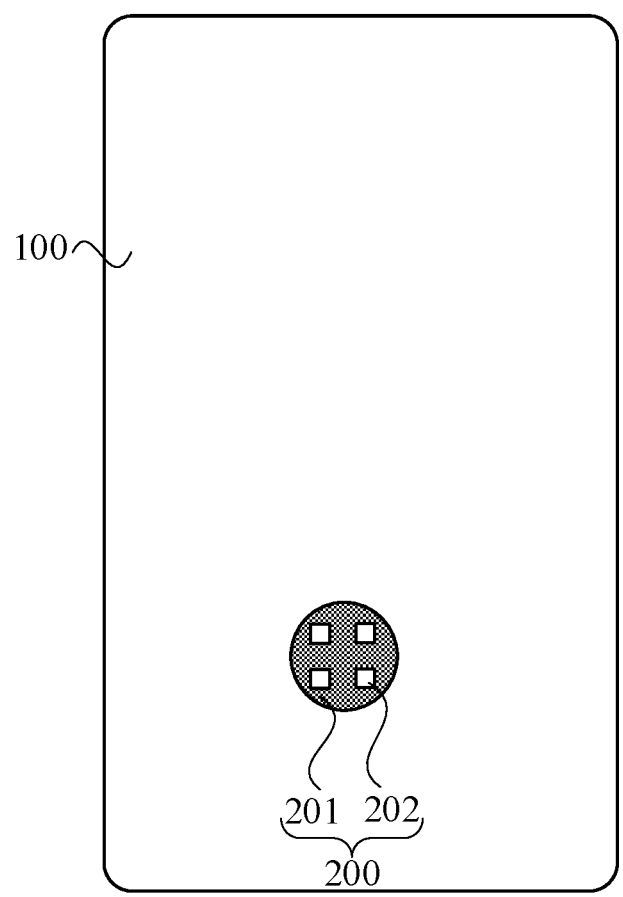
FIG. 3 is a diagram illustrating the structure of another display panel according to an embodiment of the present disclosure.

In another embodiment, the photosensor may be a fingerprint recognition module. FIG. 3 is a diagram illustrating the structure of another display panel according to an embodiment of the present disclosure, where the second display region 200 is the fingerprint recognition region. In an embodiment, the second display region 200 is not limited to the circular region shown in FIG. 3. For example, the second display region 200 may be a region taking up ¼ of the area of the display panel, located lower than the display panel. Or the second display region 200 may take up other area. Extremely, the second display region 200 may take up most or even all display region area, which is not limited by this embodiment of the present disclosure. In other embodiments, the display panel may also include an under-screen camera and an under-screen fingerprint recognition module at the same time. The second display region 200 may be located in multiple locations.

The display panel according to this embodiment of the present disclosure also includes a touch function layer integrated inside the display panel. The touch function layer together with the touch body (such as a figure) forms a capacitance so that touch function can be achieved. Since the touch function layer generally forms the electrode through light-proof metal wires, when the display panel is provided with the light-transmissive region, the light transmittance of the display region is affected due to the presence of the light-proof metal wires. In the embodiment of the present disclosure, optionally, the touch function layer includes multiple touch electrodes, and a touch electrode includes a first touch electrode and a first dummy electrode. The first dummy electrode is located within a contour surrounded by at least part of edges of at least one first touch electrode. At least one of the first touch electrode and the first dummy electrode does not overlap the light-transmissive region at least partially.

The touch function layer of this embodiment may be a touch structure adopting the principle of self-capacitive touch. When being touched, the first touch electrode serves as a sensor. The first dummy electrode is connected to the ground or is not connected to other electrical signals, so the first dummy electrode does not activate the touch control function. The first dummy electrode and the first touch electrode together form the whole layer structure of the touch function layer, which improves the evenness of the display panel.

Figure 4:
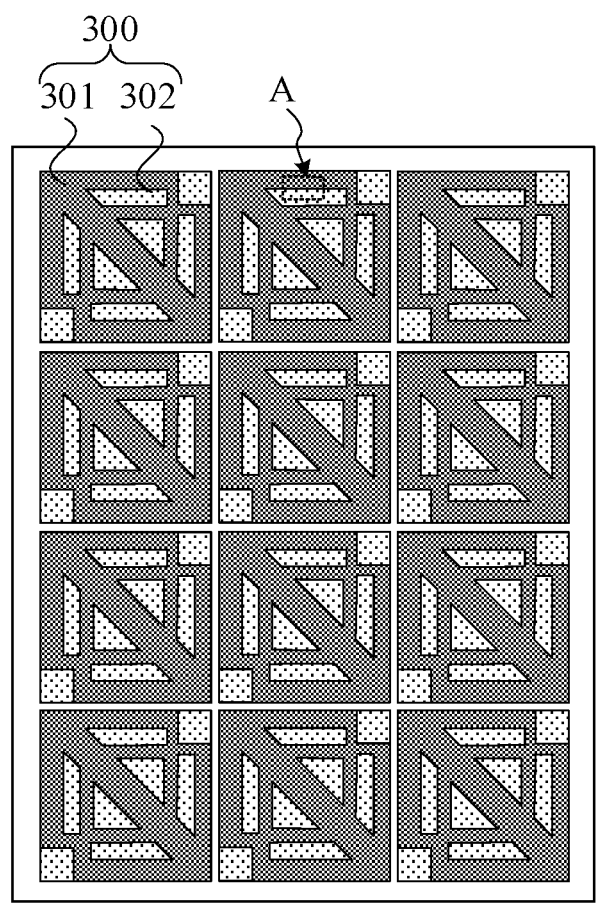
FIG. 4 is a diagram illustrating the structure of another display panel according to an embodiment of the present disclosure.
Figure 5:
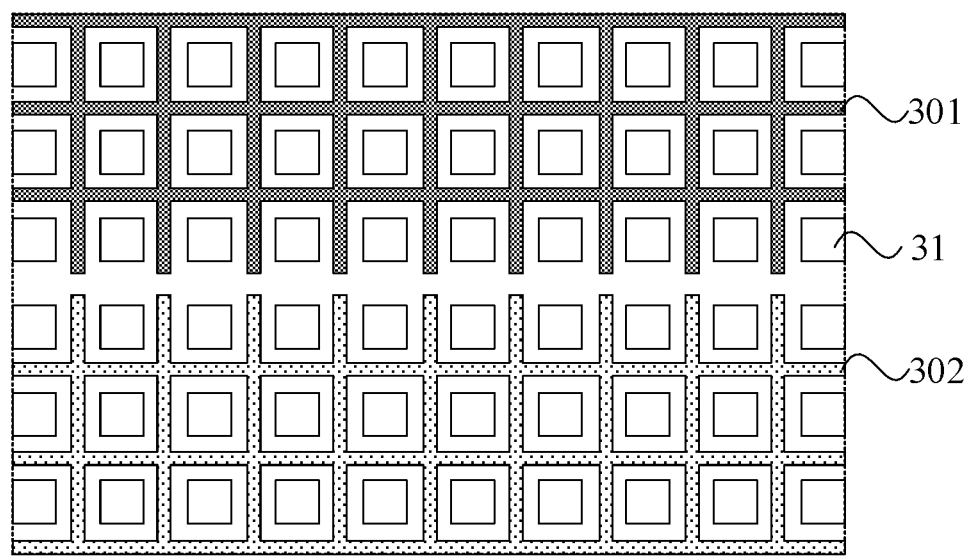
FIG. 5 is a partially enlarged view illustrating the structure of region A of FIG. 4.

Exemplarily, FIG. 4 is a diagram illustrating the structure of another display panel according to an embodiment of the present disclosure. FIG. 5 is a partially enlarged view illustrating the structure of region A of FIG. 4. Referring to FIG. 4, the display panel includes multiple touch electrodes 300, and a touch electrode 300 includes a first touch electrode 301 and a first dummy electrode 302. The first dummy electrode 302 is located within the contour surrounded by at least part of edges of the at least one first touch electrode 301.

It is to be understood that what is illustrated by FIG. 4 is the macroscopic structure of the touch electrode 300. From a macroscopic view, every touch electrode 300 may cover multiple light-emitting elements. The touch electrode 300, having a rectangular shape, includes a first touch electrode 301 and a first dummy electrode 302. Referring to FIG. 5, the first touch electrode 301 and the first dummy electrode 302 are mesh structures formed by multiple wires. The light-emitting element 31 is located in a mesh of the mesh structure. The arrangement of the light-emitting element 31 in the figure is illustrative, and may depend on the actual situation in an embodiment.

Figure 6:
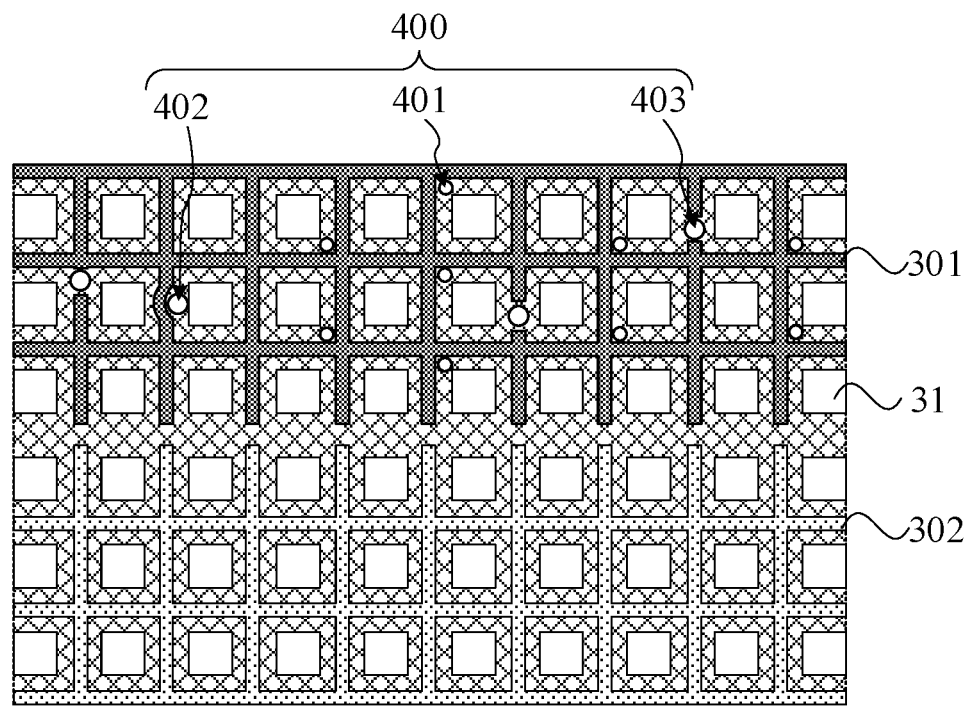
FIG. 6 is a partial view illustrating the structure of a second display region according to an embodiment of the present disclosure.

Exemplarily, FIG. 6 is a partial view illustrating the structure of a second display region according to an embodiment of the present disclosure. Referring to FIG. 6, the second display region includes multiple light-transmissive holes 400 that do not overlap the first touch electrode 301 so that the light transmittance of the light-transmissive holes 400 is ensured. Specifically, FIG. 6 shows three methods by which the light-transmissive holes 400 do not overlap the first touch electrode 301. For example, sufficient space in some positions may help the light-transmissive holes 400 to avoid the wires of the first touch electrodes 301 or help the light-transmissive holes 400 to bypass the wires of the first touch electrodes 301. To illustrate, the position of the light-transmissive hole 401 may avoid the wires of the first touch electrode 301, and the light-transmissive hole 402 is bypassed by the wires of the first touch electrode 301. Moreover, disconnection of wires is another solution. Exemplarily, at the position of the light-transmissive hole 403, due to the mesh structure of the first touch electrode 301, a few disconnections do not affect the overall electrical conductivity of the first touch electrode.

Figure 7:
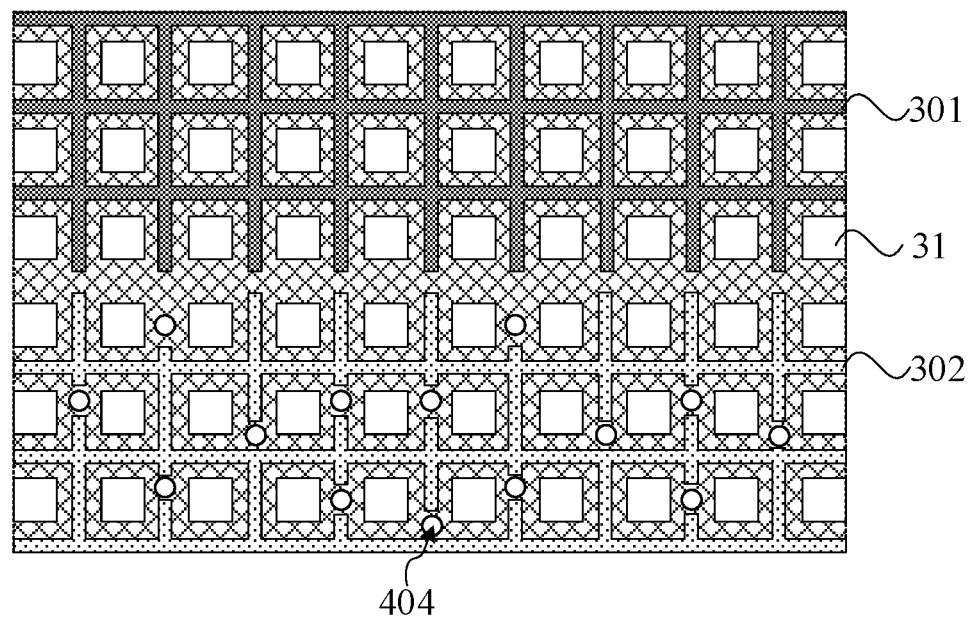
FIG. 7 is a partial view illustrating the structure of another second display region according to an embodiment of the present disclosure embodiment.

In another embodiment, to ensure the performance of the touch electrode, optionally, the light-transmissive region is disposed in the region where the first dummy electrode 302 is located; meanwhile, the first touch electrode 301 and the light-proof region overlap and the first dummy electrode 302 and the light-transmissive region do not overlap. FIG. 7 is a partial view illustrating the structure of another second display region according to an embodiment of the present disclosure. Referring to FIG. 7, the light-transmissive hole 404 is only disposed in the region where the first dummy electrode 302 is located. Since the first dummy electrode 302 does not activate touch control function, the wire disconnections of the first dummy electrode 302 has no influence on the touch control function. Therefore, the light-transmissive hole 404 in this embodiment is only disposed in the region where the first dummy electrode 302 is located, and the metal wire of the first dummy electrode 302 is not disposed at the position where the light-transmissive hole 404 is disposed, which is advantageous in disposing the large light-transmissive hole 404 and improving the light transmittance of the second display region. It can be understood that, if the condition permits, the light-transmissive hole can also be designed in a manner similar to the design in FIG. 6. The wires of the first dummy electrode 302 are wrapped to bypass the light-transmissive hole or the wires of the first dummy electrode 302 may be set to directly avoid the light-transmissive hole. In an embodiment, the design may depend on the actual situation.

Figure 8:
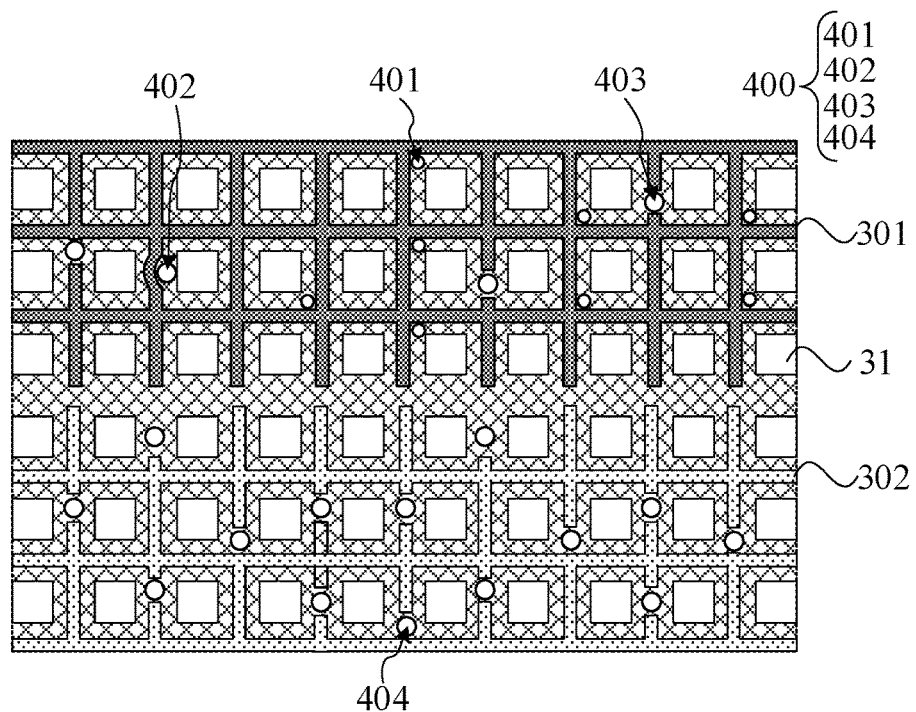
FIG. 8 is a partial view illustrating the structure of another second display region according to an embodiment of the present disclosure.

FIG. 8 is a partial view illustrating the structure of another second display region according to an embodiment of the present disclosure. Referring to FIG. 8, the light-transmissive holes 400 are provided where the first touch electrode 301 and the first dummy electrode 302 are located, and the light-transmissive holes 400 do not overlap the first touch electrode 301 or the second touch electrode 302.

It is to be noted that, in some embodiments, the wires of the first touch electrode 301 and/or the first dummy electrode 302 may partially overlap some light-transmissive holes, but the overlap should be avoided as much as possible to improve the light transmittance of the second display region.

In conclusion, in this embodiment, by ensuring that at least one of the first touch electrode 301 and the first dummy electrode 302 does not overlap the light-transmissive region at least partially in the second display region, the blocking of the light-transmissive region by the touch electrode can be avoided, thus enhancing the light transmittance of the second display region.

Figure 9:
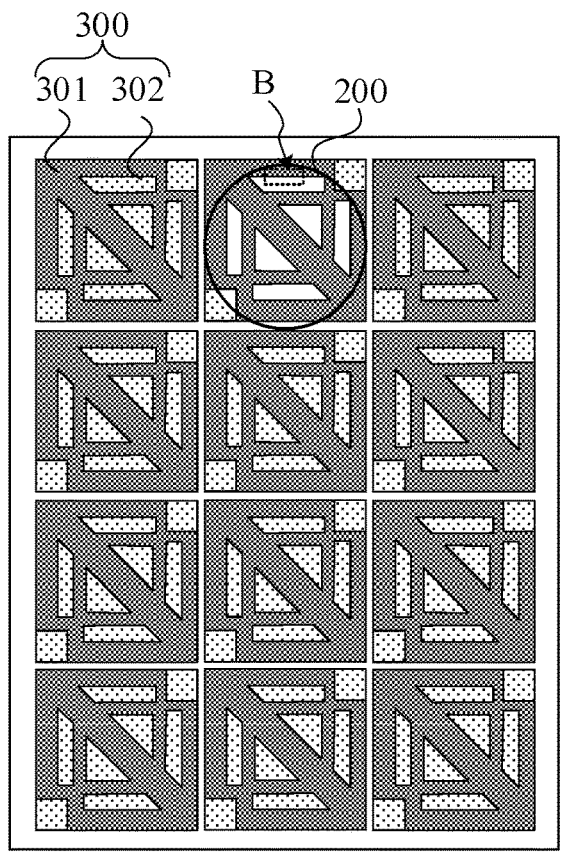
FIG. 9 is a diagram illustrating the structure of another display panel according to an embodiment of the present disclosure.

FIG. 9 is a diagram illustrating the structure of another display panel according to an embodiment of the present disclosure. Referring to FIG. 9, optionally, the first dummy electrode 302 and the second display region 200 do not overlap. That is, in this embodiment, by removing the first dummy electrode in the second display region 200, more light-transmissive holes can be provided. Hence, the light transmittance of the second display region 200 can be improved.

Figure 10:
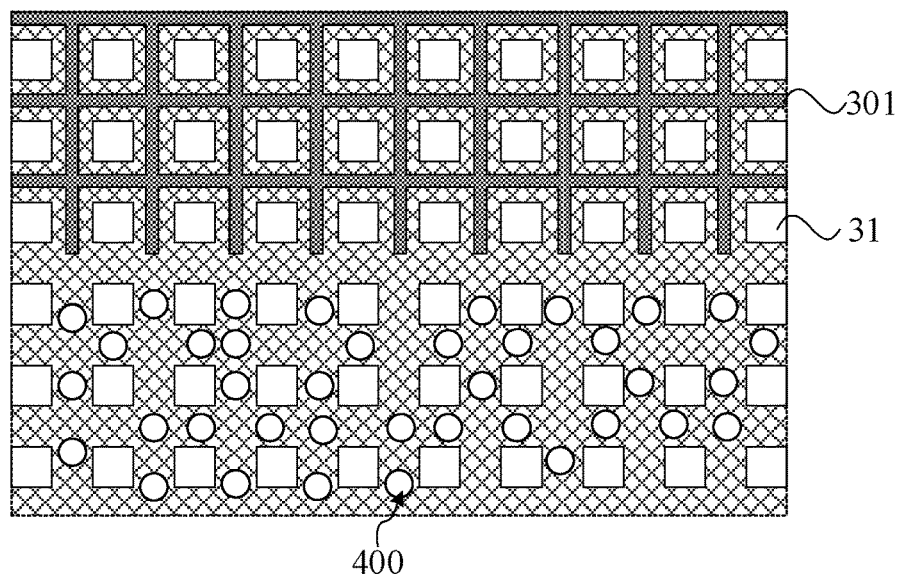
FIG. 10 is a partially enlarged view illustrating the structure of region B of FIG. 9.

Exemplarily, FIG. 10 is a partial enlarged view illustrating the structure of region B of FIG. 9. Referring to FIG. 10, the second display region is only provided with a first touch electrode 301. If the first dummy electrode is removed, more light-transmissive holes 400 can be provided in the second display region, thus improving the light transmittance. In an embodiment, the position and number of light-transmissive holes 400 may depend on the actual situation, and is not limited herein.

Figure 11:
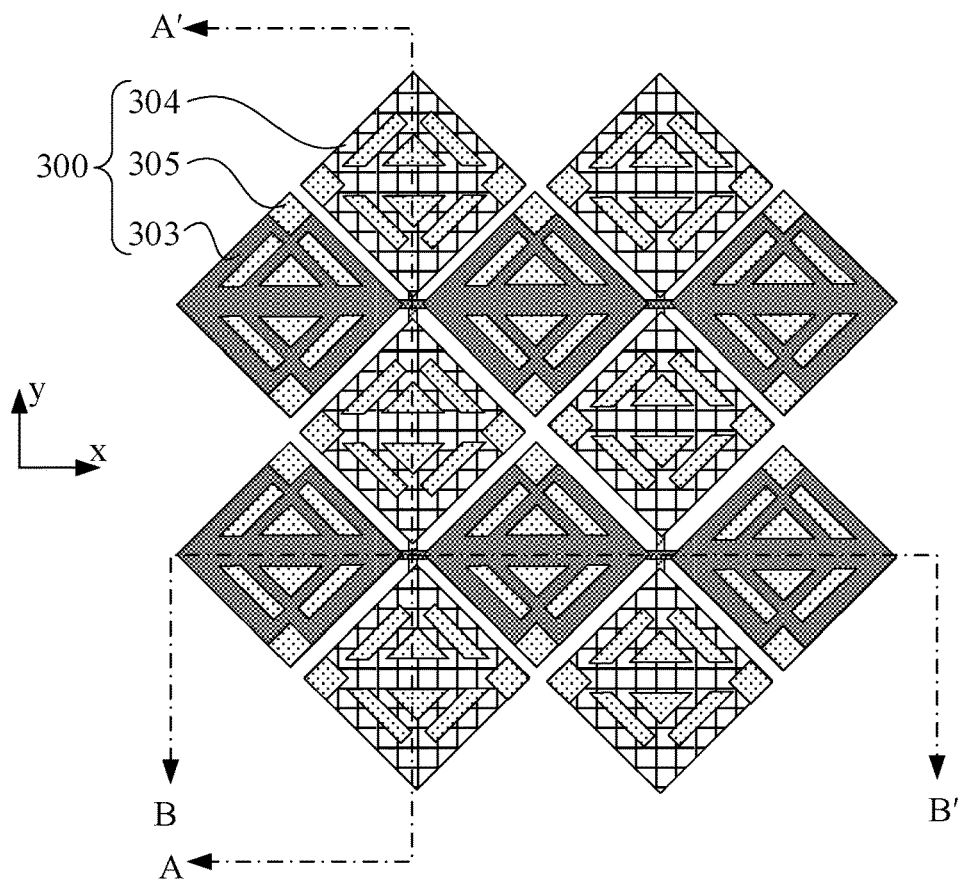
FIG. 11 is a diagram illustrating the structure of another display panel according to an embodiment of the present disclosure.

In another embodiment, the touch control structure adopting the principle of mutual capacitance can also be used. The mutual capacitive touch control structure includes a set of intersecting touch electrodes, and the region where the electrodes intersect forms a capacitance, that is, the two electrodes form the two poles of the capacitance. When the finger touches the capacitive screen, the coupling between the two electrodes near the touch point is affected, thereby changing the capacitance between the two electrodes. In detecting the value of the mutual capacity, the excitation signal is sequentially sent by one direction electrode, and all the electrodes in the other direction receive the signal at the same time. In this way, the capacitance value at the intersection of all transverse and longitudinal electrodes can be obtained, that is, the capacitance value of the two-dimensional plane of the entire touch screen. According to the data of the two-dimensional capacitance variation of the touch screen, the coordinates of each touch point can be calculated. FIG. 11 is a diagram illustrating the structure of another display panel according to an embodiment of the present disclosure. Referring to FIG. 11, optionally, the touch electrode 300 includes a second touch electrode 303, a third touch electrode 304, and a second dummy electrode 305. Multiple second touch electrodes 303 are electrically connected along the first direction x. Multiple third touch electrodes 304 are electrically connected along the second direction y. The first direction x and the second direction y are intersected. Similar to the aforementioned display panel adopting the self-capacitive touch control structure, it can be set that at least one of the second touch electrode 303, the third touch electrode 304, and the second dummy electrode 305 does not overlap the light-transmissive region at least partially so that the light transmittance of the second display region can be increased.

In another embodiment, to ensure the performance of the touch electrode, optionally, the light-transmissive region is disposed in the region where the second dummy electrode 305 is located. Both the second touch electrode 303 and the third touch electrode 304 overlap the light-proof region, and the second dummy electrode 305 does not overlap with the light-transmissive region.

Figure 12:
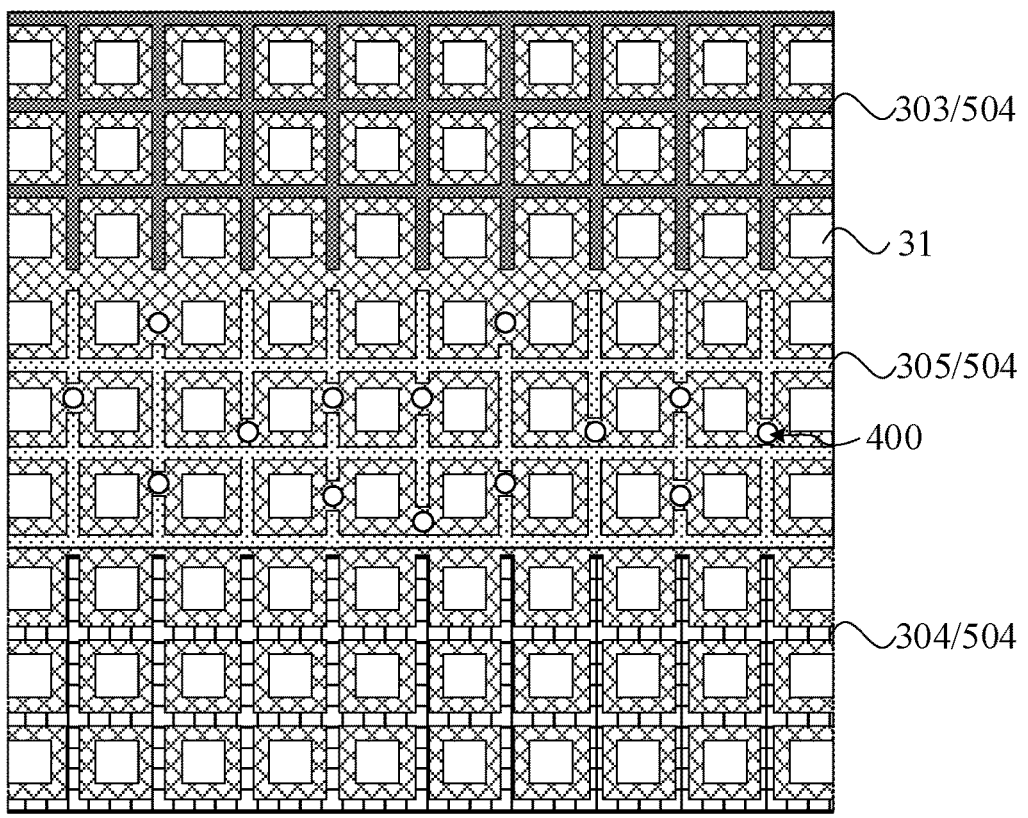
FIG. 12 is a partial view illustrating the structure of another second display region according to an embodiment of the present disclosure.

Exemplarily, FIG. 12 is a partial view illustrating the structure of another second display region according to an embodiment of the present disclosure. Referring to FIG. 12, the light-transmissive hole 400 is only disposed in the region where the second dummy electrode 305 is located. Since the second dummy electrode 305 does not function as a touch control, wire disconnection has no influence on the touch control. Therefore, the light-transmissive hole 400 is only disposed in the region where the second dummy electrode 305 is located in this embodiment. The metal wire of the second dummy electrode 305 is not disposed at the position where the light-transmissive hole 400 is disposed, which is advantageous to setting the large light-transmissive hole 400 and improves the light transmittance of the second display region.

Optionally, the touch function layer includes a first conductive layer, a first insulating layer, and a second conductive layer stacked. The first conductive layer is configured to form the second touch electrode, the third touch electrode, and the second dummy electrode. The second conductive layer is configured to form the connection wire between the second touch electrode and the third touch electrode.

Figure 13:
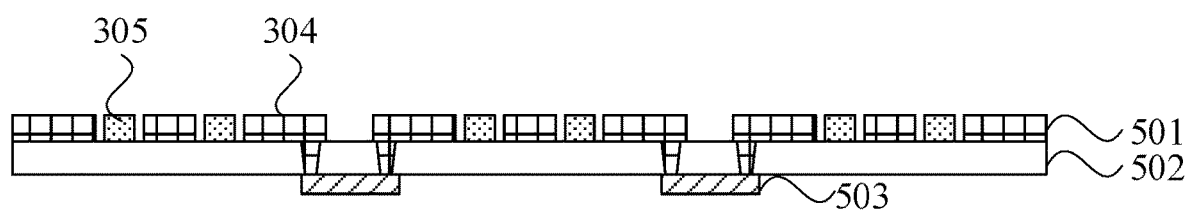
FIG. 13 is a sectional structure view taken along line AA' of FIG. 11.
Figure 14:
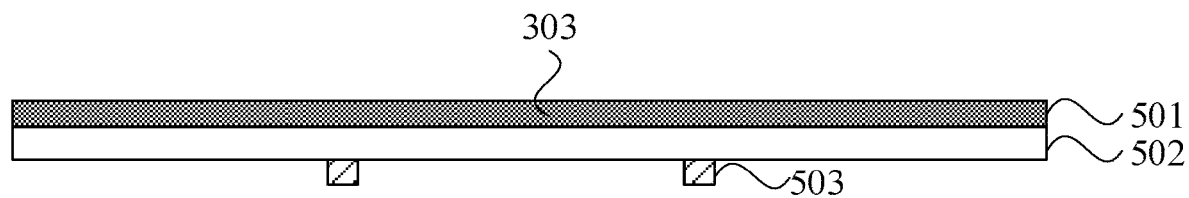
FIG. 14 is a sectional structure view taken along line BB' of FIG. 11.

FIG. 13 is a sectional structural view taken along line AA' of FIG. 11. FIG. 14 is a sectional structural view taken along line BB' of FIG. 11. Referring to FIG. 13 and FIG. 14, the touch function layer includes a first conductive layer 501, a first insulating layer 502, and a second conductive layer 503 stacked. The first conductive layer 501 is configured to form the second touch electrode 303, the third touch electrode 304, and the second dummy electrode 305. The second conductive layer 503 is configured to form the connection wire between the second touch electrode 303 and the third touch electrode 304. It is to be noted that FIG. 13 and FIG. 14 only illustrate the sectional structure of the touch function layer. Other structures of the display panel are not illustrated.

In an embodiment, the first conductive layer 501 may form a grid-like structure in the entire layer. According to the shape of touch electrodes, the first conductive layer 501 may be divided into the second touch electrode 303, the third touch electrode 304, and the second dummy electrode 305.

Optionally, the first conductive layer includes multiple metal wires in a mesh structure, and a metal wire does not overlap the light-transmissive region in the second display region.

With continued to FIG. 12, the mesh structure includes multiple metal wires 504, which are located within the first conductive layer. In this embodiment, the location of the light-transmissive holes 400 avoids the location of the metal wires 504, that is, the metal wires 504 do not overlap the light-transmissive region, preventing the metal wires 504 from affecting the light transmittance of the second display region.

Optionally, the metal wires may be disconnected in the area when the metal wires overlap the light-transmissive region, or the metal wires at least partially surround the light-transmissive region.

Figure 15:
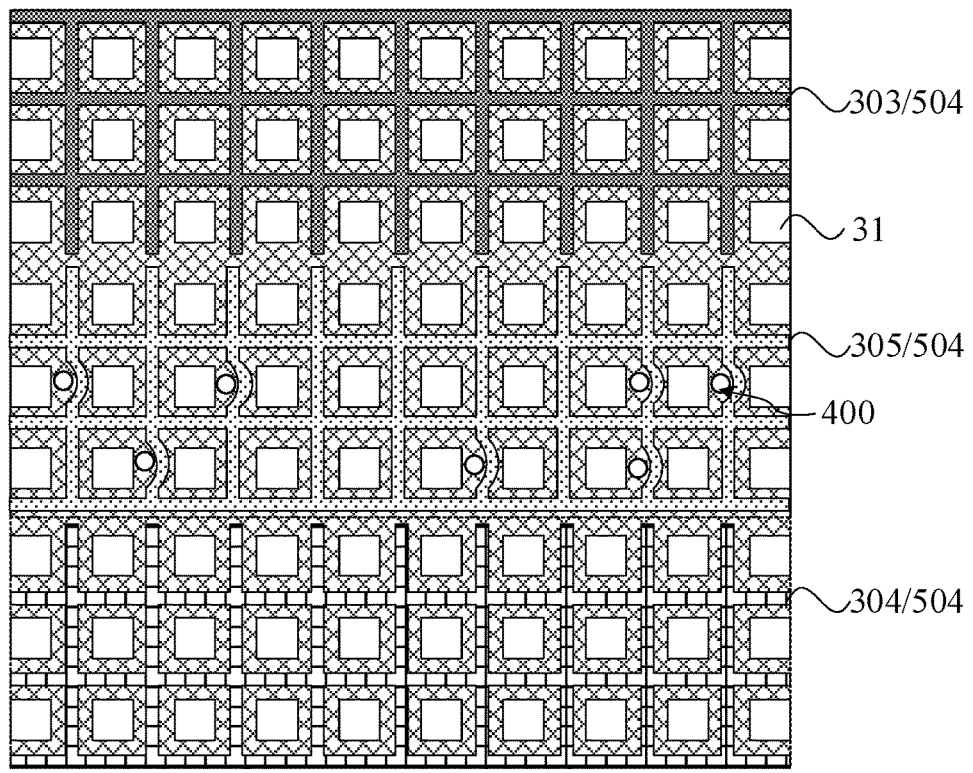
FIG. 15 is a partial view illustrating the structure of another second display region according to an embodiment of the present disclosure.

Exemplarily, with continued to FIG. 12, the metal wires 504 includes multiple disconnected regions, corresponding to the light-transmissive holes 400, to avoid shielding light and affecting the light transmittance. FIG. 15 is a partial view illustrating the structure of another second display region according to an embodiment of the present disclosure. Referring to FIG. 15, the metal wires 504 includes multiple arc regions, which partially surround the light-transmissive holes 400. In other embodiments, the metal wires 504 may be provided with a disconnected area and an arc area at the same time. Or in some embodiments, for example, when the width of the metal wire is relatively wide, the metal wires may be provided with via holes corresponding to the light-transmissive holes. In an embodiment, the design may depend on the actual situation.

Figure 16:
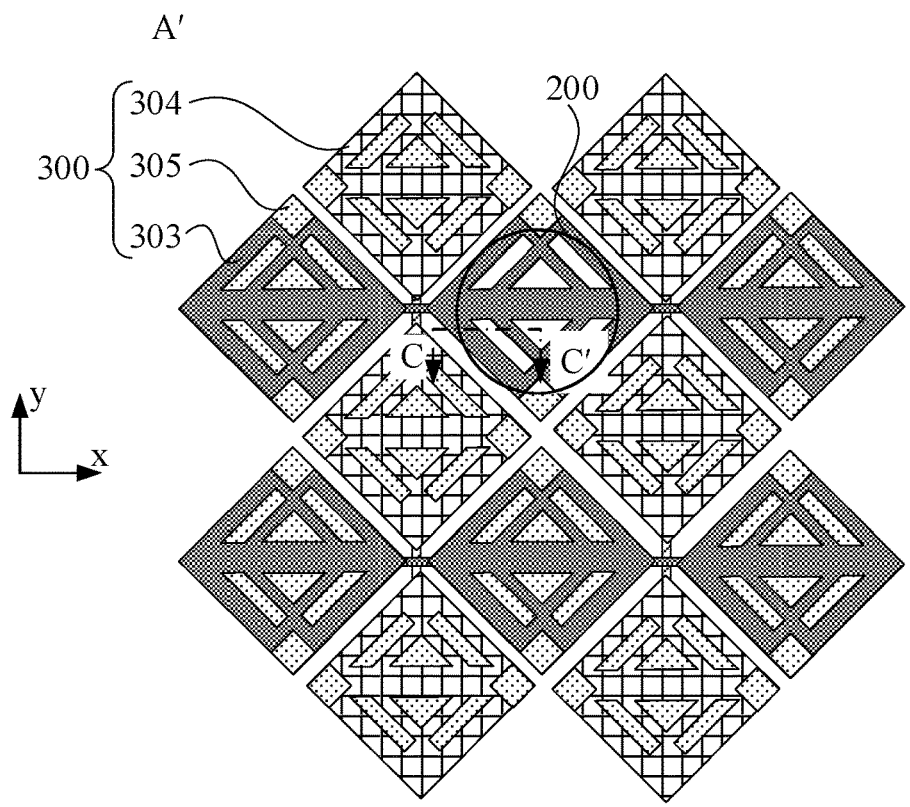
FIG. 16 is a diagram illustrating the structure of another display panel according to an embodiment of the present disclosure.

FIG. 16 is a diagram illustrating the structure of another display panel according to an embodiment of the present disclosure. Referring to FIG. 16, optionally, the second dummy electrode 305 does not overlap the second display region 200. That is, in this embodiment, the second dummy electrode in the second display region 200 is removed so that more space is reserved for the installation of light-transmissive holes to improve the light transmittance of the second display region 200.

Figure 17:
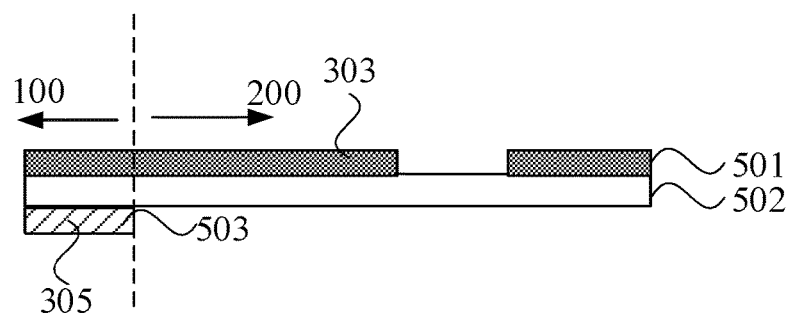
FIG. 17 is a sectional structure view taken along line CC' of FIG. 16.

FIG. 17 is a sectional structural view taken along line CC' of FIG. 16. Referring to FIG. 17, optionally, the touch function layer includes a first conductive layer 501, a first insulating layer 502, and a second conductive layer 503 stacked. The first conductive layer 501 is configured to form the second touch electrode 303, the third touch electrode 304 and the second dummy electrode 305. The second conductive layer 503 is configured to form connection wires between the second touch electrodes 303, or to form connection wires between the third touch electrodes 304. In the first display region 100, a third dummy electrode 306 is provided where the second conductive layer 503 is located.

It is to be understood that the light transmittance of the second display region 200 can be increased by removing the second dummy electrode in the second display region 200. However, the removal of the second dummy electrode in the second display region 200 may result in a decrease in the consistency of the capacitance between the touch electrode in the second display region 200 and the touch electrode in the first display region 100. Therefore, in this embodiment, a third dummy electrode 306 is provided in the first display region 100 adjacent to the second display region 200, to compensate for the missing capacitance due to the removal of the second dummy electrode. The shape of the third dummy electrode 306 is not limited, but only needs to be insulated from the bridge structure.

Figure 18:
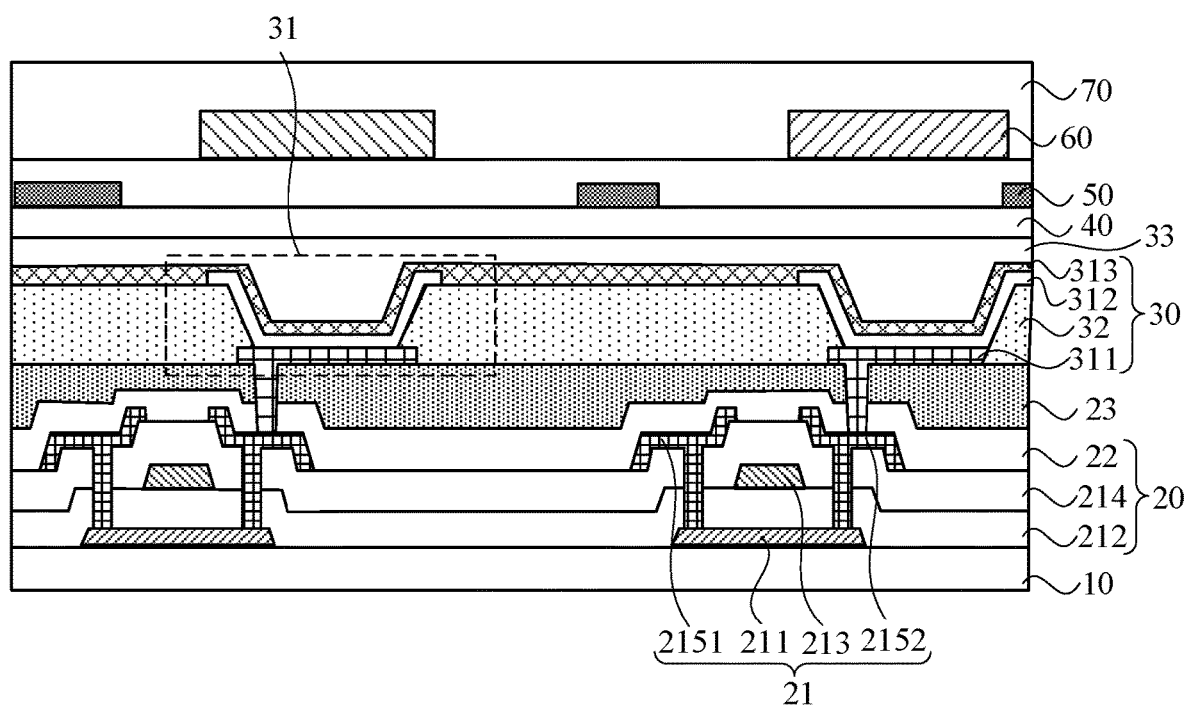
FIG. 18 is a sectional structure view of a first display region according to an embodiment of the present disclosure.

FIG. 18 is a sectional structural view of a first display region according to an embodiment of the present disclosure. Referring to FIG. 18, the display panel includes a substrate 10, which may be flexible and thus stretchable, foldable, bendable or curlable, such that the touch display panel may be stretchable, foldable, flexible or curlable. The substrate 10 may be made of any suitable insulating materials with flexibility. The substrate 10 is configured to block oxygen and moisture, preventing moisture or impurities from diffusing through the substrate 10 and forming a planar surface on the upper surface of the substrate 10. For example, the substrate 10 may be formed of a polymer material such as polyimide (PI), polycarbonate (PC), polyether sulfone (PES), polyethylene terephthalate (PET), polyethylene naphthalate (PEN), polyarylate (PAR), or glass fiber reinforced plastic (GFRP). The substrate 10 may be transparent, translucent, or opaque. Optionally, the display panel may also include a buffer layer (not shown in FIG. 18) located on the substrate 10, which may cover the entire upper surface of the substrate 10. The substrate 10 may also be rigid, such as a glass substrate, to form a rigid display panel.

The display panel includes a pixel circuit layer 20 located on a side of the substrate 10. Specifically, the pixel circuit layer 20 is located on the side of the substrate 10 facing towards the display surface or the touch surface of the display panel. The pixel circuit layer 20 may include multiple thin-film transistors (TFTs) 21 and a pixel circuit composed of the thin-film transistors 21 for driving the light-emitting elements in the display layer. Exemplarity, in the embodiment of the present disclosure, the structure description will be made in the case of a top-gate type thin-film transistor. A thin-film transistor 21 includes an active layer 211 disposed on the substrate 10. The active layer 211 may be made of an amorphous silicon material, a polysilicon material, or a metal oxide material. The active layer 211, when made of a polysilicon material, may be formed by low-temperature amorphous silicon technique, a process when an amorphous silicon material is made into a polysilicon material by laser melting. In an embodiment, optionally, the pixel circuit layer 21 includes multiple thin-film transistors 21, including a thin-film transistor based on the low-temperature polycrystalline silicon (LTPS) and a thin-film transistor based on the metal oxide semiconductor. Among them, the metal oxide semiconductor may include indium gallium zinc oxide (IGZO), which compared with LTPS, has the characteristics of higher transmittance, lower electron mobility, larger switching ratio and lower power consumption. The pixel circuit formed with two kinds of transistors has better performance. Moreover, various methods such as the rapid thermal annealing (RTA), the solid phase crystallization (SPC), the excimer laser annealing (ELA), the metal induced crystallization (MIC), the metal induced lateral crystallization (MILC) method, or the succession lateral solidification (SLS) may also be used for forming the active layer 211. The active layer 211 also includes a source region and a drain region that are formed by doping N-type impurity ions or P-type impurity ions. A channel region is disposed between the source region and the drain region. The pixel circuit layer 20 also includes a gate insulating layer 212 on the active layer 211. The gate insulation layer 212 includes an inorganic layer made of silicon oxide or silicon nitride, and the gate insulation layer 212 may include a single layer or multiple layers. The thin-film transistor 21 also includes a gate 213 located on the gate insulating layer 212. The gate 213 may include a single layer or multiple layers of aurum (Au), argentum (Ag), cuprum (Cu), nickel (Ni), platinum (Pt), palladium (Pd), aluminum (Al), molybdenum (MO), or chromium (Cr), or an alloy such as the aluminum (Al)-neodymium (Nd) alloy or the molybdenum (MO)-wolfram (W) alloy. In an embodiment, the design may depend on the actual situation. The pixel circuit layer 20 also includes an interlayer insulating layer 214 located on the gate 213. The interlayer insulating layer 214 may include the inorganic material or the organic material. The inorganic materials may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic materials may include at least one of acrylic resin, methacrylic resin, polyisoprene, vinyl resin, epoxy resin, urethane resin, cellulose resin, and perylene resin. The thin-film transistor 21 also includes a source electrode 2151 and a drain electrode 2152 both located on the interlayer insulating layer 214. The source electrode 2151 and the drain electrode 2152 are electrically connected to a source region and a drain region through contact openings respectively. The contact openings are formed by selectively removing the gate insulating layer 212 and the interlayer insulating layer 214.

The pixel circuit layer 20 may also include a passivation layer 22. Optionally, the passivation layer 22 is located on the source electrode 2151 of the thin-film transistor 21 and the drain electrode 2152 of the thin-film transistor 21. The passivation layer 22 may be formed of inorganic materials such as silicon oxide and silicon nitride or organic materials. The display panel may also include a planarization layer 23. Optionally, the planarization layer 23 is located on the passivation layer 22. The planarization layer 23 may include organic materials such as arcylic, polyimide (PI), or benzo-cyclobutene (BCB), and etc. The planarization layer 23 serves to planarize.

The display panel includes a display layer 30 on the side of the pixel circuit layer 20 facing away from the substrate 10, and the display layer 30 includes multiple light-emitting elements 31. Optionally, the display layer 30 is located on the planarization layer 23. The display layer 30 includes a first electrode layer 311, a light-emitting layer 312, and a second electrode layer 313, which are sequentially disposed in a direction away from the substrate 10. The first electrode layer 311 may be formed of various conductive materials. For example, the first electrode layer 311 may be an anode layer, and may be formed as a transparent electrode or a reflective electrode depending on the use. When an anode is formed as a transparent electrode, the transparent electrode may include indium tin oxide (ITO), indium zinc oxide (IZO), zinc oxide (ZO), indium oxide (InO), and etc. When an anode is formed as a reflective electrode, the reflective layer may be formed of argentum (Ag), magnesium (Mg), aluminum (Al), platinum (Pt), palladium (Pd), gold (Au), nickel (Ni), neodymium (Nd), iridium (Ir), chromium (Cr), or their mixtures. ITO, IZO, ZnO, or InO or the like may be formed on the reflective layer. The light-emitting layer 312 may include the low molecular material or the high molecular material. When the light-emitting layer 312 includes the low molecular material, the light-emitting layer 312 may include an emission layer (EML), and may also include at least one of hole injection layer (HIL), hole transport layer (HTL), electron transport layer (ETL), and electron injection layer (EIL). The light-emitting layer 312 may include various organic materials such as Copper phthalocyanine (CuPc), N,N-Di(1-naphthyl)-N,N'-diphenyl-(1,1'-biphenyl) (NPB), or tris-(8-hydroxyquinoline)aluminum (Alq3), and etc. The light-emitting layer 312 may be formed by vapor deposition. When the light-emitting layer 312 includes the polymer material, the light-emitting layer 312 may include HTL and EML. HTL may include PEDOT, and EML may include the polyphenylene vinylidene (PPV)-based material and the polyfluorene-based higher molecular material. The light-emitting layer 320 may be formed by screen printing, inkjet printing, laser-induced thermal imaging (LITI), and etc.

However, the light-emitting layer 312 is not limited to the above example. The light-emitting layer 312 may include a single layer spanning multiple first electrode layers 311 or multiple patterned layers corresponding to the first electrode layers 311. The display layer 30 also includes a pixel defining layer 32 located on the side of the first electrode layer 311 facing away from the pixel circuit layer 20. The pixel defining layer 32 may be made of organic materials such as polyimide (PI), polyamide, benzocyclobutene (BCB), acrylic resin, phenolic resin or the like, or be made of inorganic material such as silicon nitride (SiNx). When the second electrode layer 313 (the cathode layer) is formed as the transparent electrode, lithium (Li), calcium (Ca), lithium/calcium fluoride (LiF/Ca), lithium/aluminum fluoride (LiF/Al), aluminum, magnesium, or a combination thereof with little work function may be, by evaporation, initially deposited on the light-emitting layer 312, and forming materials of the transparent electrode such as ITO, IZO, ZnO, or InO may be deposited on the compound. When a cathode is formed as a reflective electrode, the cathode may be formed by evaporating Li, Ca, LiF/Ca, LiF/Al, Al, Mg or a combination thereof on the entire surface of the substrate.

Optionally, the first electrode layer 311 includes multiple anode patterns (first electrodes) in a one-to-one correspondence with pixels, and the anode patterns in the first electrode layer 311 are connected to the source electrode 2151 or the drain electrode 2152 of the thin-film transistor 21 through the via hole on the planarization layer 23. The pixel defining layer 32 includes multiple openings exposing the first electrode layer 311, and the pixel defining layer 32 may cover edges of the pattern of the first electrode layer 311. The light-emitting layer 312 is at least partially accommodated within the opening of the pixel defining layer 32 and is connected with the first electrode layer 311.

Optionally, the first electrode layer 311, the light-emitting layer 312, and the second electrode layer 313 defined by the opening of each pixel defining layer 32 constitute the light-emitting element 31 (as shown in the dashed box in FIG. 18). Each light-emitting element 31 is capable of emitting lights of different colors according to different light-emitting layers 312. Each light-emitting element 31 constitutes a sub-pixel. Multiple sub-pixels jointly perform image display.

Optionally, the display panel also includes an encapsulation layer 40 located on the display layer 30, and the encapsulation layer 40 completely covers the display layer 30 to seal the display layer 30. To planarize the display layer 30, a planarization layer 33 is also provided above the display layer. Optionally, the encapsulation layer 40 may be a thin film encapsulation layer, located on the planarization layer 33, including a first inorganic encapsulation layer, an organic encapsulation layer, and a second inorganic encapsulation layer (particular films of the encapsulation layer 40 are not shown in FIG. 18), arranged in sequence in a direction away from the substrate 10, for avoiding the light-emitting element 31 from being corroded by water and oxygen. Certainly, in other optional embodiments of the present disclosure, the encapsulation layer 40 may include stacked organic and inorganic material layers in any number as desired, but it should be ensured that at least one organic material layer and at least one inorganic material layer are alternately deposited, and the lowermost layer and the uppermost layer are composed of inorganic materials.

The display panel also includes a touch function layer 50 located on the encapsulation layer 40. The touch function layer 50 includes multiple touch electrodes. To realize touch control function, the self-capacitance method or the mutual capacitance method may be used. The touch function layer 50 may be provided with a single-layer touch electrode or a double-layer touch electrode, or may be provided with a metal mesh touch electrode. The metal mesh touch electrode includes multiple metal wires along two mutually intersecting directions. The metal wires in different directions form a mesh by intersection. In an embodiment, the design may depend on the actual situation.

The display panel also includes a color resist layer 60, which includes multiple color resists 61 one-to-one corresponding to light-emitting elements 31. The display panel also includes a protective layer 70 located on the color resist layer 60. Optionally, the protective layer 70 is the outermost film of the display panel, so the protective layer 70 may serve as the protective plate or the protective film. The protective layer 70 may be bonded to the film inside the adjacent display panel by optically clear adhesive (OCA). The surface of the protective layer 70 is the operating surface for touch control of the display panel. In other embodiments, the touch function layer may also be located above the color resist layer 60 to form a TPOC (TP on CF) structure, and may be designed depending on the actual situation in an embodiment.

Referring to FIG. 18, the first display region does not include the structure of the light-transmissive region, and thus the second electrode layer 313 is generally a translucent film for the entire layer. To improve the light transmittance of the second display region, optionally, in the second display region, the second electrode layer includes a second electrode which is patterned, and the second electrode layer includes multiple openings corresponding to the light-transmissive region.

Figure 19:
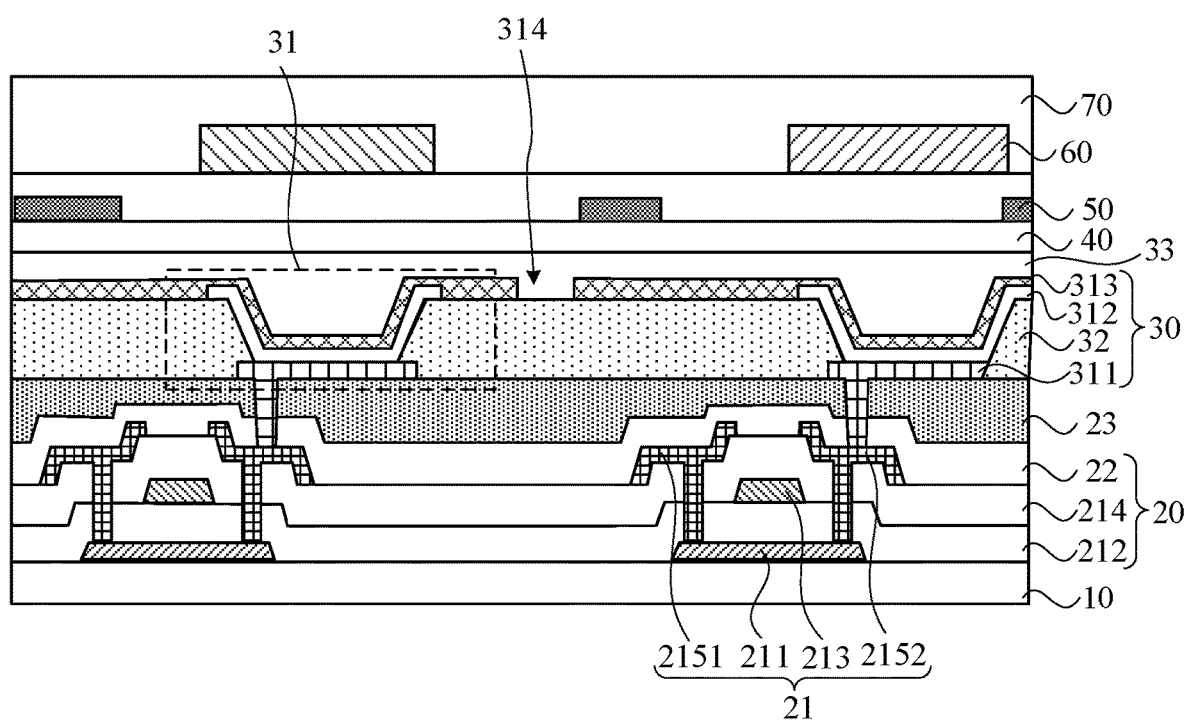
FIG. 19 is a sectional structure view of a second display region according to an embodiment of the present disclosure.

Exemplarily, FIG. 19 is a sectional structural view of a second display region according to an embodiment of the present disclosure. Referring to FIG. 19, by designing the opening 314 corresponding to the light-transmissive region at the second electrode layer 313, the light transmittance of the light-transmissive region can be also enhanced.

Figure 20:
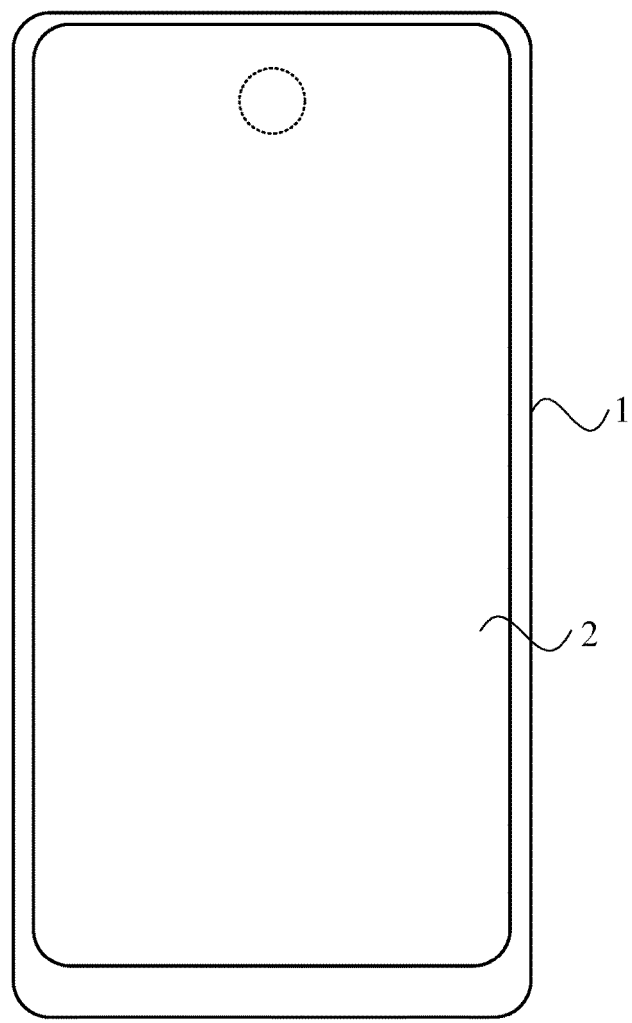
FIG. 20 is a diagram illustrating the structure of a display device according to an embodiment of the present disclosure.

FIG. 20 is a diagram illustrating the structure of a display device according to an embodiment of the present disclosure. Referring to FIG. 20, the display device 1 includes a display panel 2 in any one of the embodiments according to the present disclosure. Specifically, the display device 1 may be a mobile phone, a computer, a wearable intelligent device, and etc.

Figure 21:
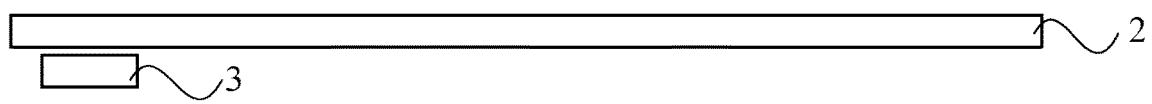
FIG. 21 is a diagram illustrating the structure of another display device according to an embodiment of the present disclosure.

FIG. 21 is a diagram illustrating the structure of another display device according to an embodiment of the present disclosure. Referring to FIG. 21, optionally, the display device also includes a fingerprint recognition module 3 located in the second display region and on the side facing away from the light exiting surface of the display panel 2.

Figure 22:
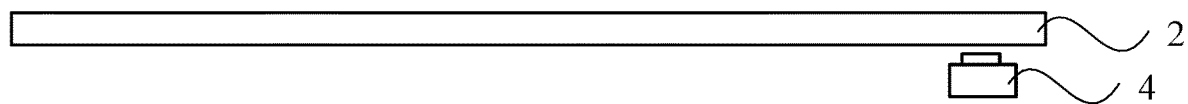
FIG. 22 is a diagram illustrating the structure of another display device according to an embodiment of the present disclosure.

FIG. 22 is a diagram illustrating the structure of another display device according to an embodiment of the present disclosure. Referring to FIG. 22, optionally, the display device also includes a camera 4 located in the second display region and on the side facing away from the light exiting surface of the display panel 2.

In an embodiment, the display device may include both the under-screen camera and the under-screen fingerprint recognition module. In an embodiment, the design may depend on the actual situation.

It is to be noted that the preceding are only preferred embodiments of the present disclosure and technical principles used therein. The skilled in the art will understand that the present disclosure is not limited to the particular embodiment herein, and that it is possible for those skilled in the art to make a variety of significant changes, readjustments, interactions, and substitutions without departing from the protection scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
    a first display region and a second display region, wherein the second display region comprises a plurality of light-proof regions and a plurality of light-transmissive regions and also serves as a photosensor region,
    wherein the display panel further comprises a touch function layer comprising a plurality of touch electrodes,
    wherein within the second display region, a touch electrode of the plurality of touch electrodes and a light-proof region of the plurality of light-proof regions overlap at least partially, and the touch electrode and a light-transmissive region of the plurality of light-transmissive regions do not overlap at least partially, and
    wherein a touch electrode of the plurality of touch electrodes comprise a first touch electrode and a first dummy electrode, and the first dummy electrode is located within a contour formed by at least part of edges of at least one first touch electrode of the plurality of touch electrodes; and
    at least one of the first touch electrode or the first dummy electrode does not overlap a light-transmissive region of the plurality of light-transmissive regions at least partially.

2. The display panel of claim 1, wherein the light-transmissive region is disposed in a region where the first dummy electrode is located, the first touch electrode overlaps a light-proof region of the plurality of light-proof regions, and the first dummy electrode does not overlap the plurality of light-transmissive regions.

3. The display panel of claim 1, wherein the first dummy electrode does not overlap the second display region.

4. A display panel, comprising:
    a first display region and a second display region, wherein the second display region comprises a plurality of light-proof regions and a plurality of light-transmissive regions and also serves as a photosensor region,
    wherein the display panel further comprises a touch function layer comprising a plurality of touch electrodes,
    wherein within the second display region, a touch electrode of the plurality of touch electrodes and a light-proof region of the plurality of light-proof regions overlap at least partially, and the touch electrode and a light-transmissive region of the plurality of light-transmissive regions do not overlap at least partially, and
    wherein a touch electrode of the plurality of touch electrodes comprise a second touch electrode, a third touch electrode, and a second dummy electrode; a plurality of second touch electrodes are electrically connected along a first direction; and a plurality of third touch electrodes are electrically connected along a second direction, wherein the first direction intersects the second direction; and
    at least one of the second touch electrode, the third touch electrode, or the second dummy electrode does not overlap a light-transmissive region of the plurality of light-transmissive regions at least partially.

5. The display panel of claim 4, wherein the light-transmissive region is disposed in a region where the second dummy electrode is located, both the second touch electrode and the third touch electrode overlap a light-proof region of the plurality of light-proof regions, and the second dummy electrode does not overlap the light-transmissive region.

6. The display panel of claim 5, wherein the touch function layer comprises a first conductive layer, a first insulating layer, and a second conductive layer, wherein the first conductive layer, the first insulating layer, and the second conductive layer are stacked,
wherein the first conductive layer is configured to form the second touch electrode, the third touch electrode, and the second dummy electrode; and the second conductive layer is configured to form connection wires between the plurality of second touch electrodes or connection wires between the plurality of third touch electrodes.

7. The display panel of claim 6, wherein the first conductive layer comprises a plurality of metal wires in a mesh structure, wherein a metal wire of the plurality of metal wires does not overlap the light-transmissive region within the second display region.

8. The display panel of claim 7, wherein the metal wire is disconnected by overlaps between the metal wire and the light-transmissive region, or the metal wire surrounds the light-transmissive region at least partially.

9. The display panel of claim 4, wherein the second dummy electrode does not overlap the second display region.

10. The display panel of claim 9, wherein the touch function layer comprises a first conductive layer, a first insulating layer, and a second conductive layer, wherein the first conductive layer, the first insulating layer, and the second conductive layer are stacked,
wherein the first conductive layer is configured to form the second touch electrode, the third touch electrode, and the second dummy electrode; and the second conductive layer is configured to form connection wires between the plurality of second touch electrodes or connection wires between the plurality of third touch electrodes; and
wherein within the first display region, a third dummy electrode is disposed at a same layer as the second conductive layer.

11. A display device, comprising the display panel according to claim 4.

12. A display panel, comprising:
a first display region and a second display region, wherein the second display region comprises a plurality of light-proof regions and a plurality of light-transmissive regions and also serves as a photosensor region,
wherein the display panel further comprises a touch function layer comprising a plurality of touch electrodes,
wherein within the second display region, a touch electrode of the plurality of touch electrodes and a light-proof region of the plurality of light-proof regions overlap at least partially, and the touch electrode and a light-transmissive region of the plurality of light-transmissive regions do not overlap at least partially, and
wherein the display panel further comprises:
a substrate;
a pixel circuit layer located on a side of the substrate; and
a plurality of light-emitting elements located on a side of the pixel circuit layer facing away from the substrate, wherein the touch function layer is located on a side of the plurality of light-emitting elements facing away from the pixel circuit layer,
wherein the display panel further comprises a first electrode layer, a light-emitting layer, and a second electrode layer which are sequentially stacked in a direction away from the substrate, wherein
the first electrode layer comprises a plurality of first electrodes one-to-one corresponding to the plurality of light-emitting elements, and within the second display region, the second electrode layer comprises second electrodes which are patterned, and the second electrode layer comprises a plurality of openings one-to-one corresponding to the plurality of light-transmissive regions.

13. The display panel of claim 12, wherein the pixel circuit layer comprises a plurality of thin-film transistors, wherein the plurality of thin-film transistors comprise a thin-film transistor based on low-temperature polycrystalline silicon and a thin-film transistor based on a metal oxide semiconductor.

14. The display panel of claim 12, further comprising a color resist layer which comprises a plurality of color resists one-to-one corresponding to the plurality of light-emitting elements.

15. The display panel of claim 12, further comprising a thin-film encapsulation layer located between the plurality of light-emitting elements and the touch function layer.

16. A display device, comprising the display panel according to claim 12.

17. A display device, comprising the display panel according to claim 1.

18. The display device of claim 17, further comprising a fingerprint recognition module located in the second display region and on a side of the display panel facing away from a light-emitting surface of the display panel.

19. The display device of claim 17, further comprising a camera located in the second display region and on a side of the display panel facing away from a light-emitting surface of the display panel.

* * * * *